(12) United States Patent
Berndt et al.

(10) Patent No.: US 7,428,678 B1
(45) Date of Patent: Sep. 23, 2008

(54) SCAN TESTING OF INTEGRATED CIRCUITS WITH HIGH-SPEED SERIAL INTERFACE

(75) Inventors: Paul D. Berndt, Woodinville, WA (US); Steven Larky, Del Mar, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 388 days.

(21) Appl. No.: 11/215,278

(22) Filed: Aug. 30, 2005

Related U.S. Application Data

(60) Provisional application No. 60/612,276, filed on Sep. 22, 2004.

(51) Int. Cl.
*G01R 31/28* (2006.01)
(52) U.S. Cl. .................... 714/729; 714/727
(58) Field of Classification Search ............... 714/719, 714/727, 30, 726, 729; 710/52; 702/186
See application file for complete search history.

(56) References Cited

U.S. PATENT DOCUMENTS

| | | | | |
|---|---|---|---|---|
| 5,815,509 | A * | 9/1998 | Deng et al. | 714/719 |
| 5,862,152 | A * | 1/1999 | Handly et al. | 714/727 |
| 6,665,817 | B1 * | 12/2003 | Rieken | 714/30 |
| 6,728,799 | B1 * | 4/2004 | Perner et al. | 710/52 |
| 7,155,370 | B2 * | 12/2006 | Nejedlo | 702/186 |

OTHER PUBLICATIONS

Ajay Khoche "Test Resource Partitioning for Scan Architectures Using Bandwidth Matching", Oct. 2002 pp. 1.4-1 to 1.4-8, IEEE Test Resource Partitioning Workshop, Agilent Technologies, California.
Alfred L. Crouch, "Design-for-Test for Digital IC's and Embedded Core Systems" 1999, pp. 92-133, Prentice Hall PTR., New Jersey.
Gregory A. Maston, et al., "Elements of STIL Principles and Applications of IEEE Std. 1450", 2003, pp. 200-205, Kluwer Academic Publishers, U.S.
Michael Santarini, et al. "SynTest Readies Scan-Test Data Compaction Tool", EETimes Global News for the Creators of Technology, Sep. 2, 2002, [online][retrieved on Aug. 17, 2005]. Retrieved from the Internet; <URL:http://www.eetimes.com/story/DEG20020902S0027>.
VirtualScan "Tool Suite for Virtual Scan Synthesis and ATPG (Automatic Test Pattern Generation)", Webpage [online][retrieved on Aug. 17, 2005]. Retrieved from the Internet:<URL:http:www.syntest.com/ProdDataSheet/Virtualscan.pdf>.

* cited by examiner

*Primary Examiner*—David Ton
(74) *Attorney, Agent, or Firm*—Okamoto & Benedicto LLP

(57) ABSTRACT

In one embodiment, an integrated circuit includes a serial link interface configured to send and receive data over a serial bus both during normal operation and during scan tests. The integrated circuit may include data routing circuitry for transferring data between the serial link interface and a scan chain during a scan test, and for transferring data between the serial link interface and a core logic circuit of the integrated circuit, without going through the scan chain, during normal operation. Scan data may be generated and analyzed by a tester integrated circuit coupled to the integrated circuit over the serial bus.

7 Claims, 3 Drawing Sheets

SCAN TESTING OF INTEGRATED CIRCUITS WITH HIGH-SPEED SERIAL INTERFACE

CROSS-REFERENCE TO RELATED APPLICATION

This application claims the benefit of U.S. Provisional Application No. 60/612,276, filed on Sep. 22, 2004, which is incorporated herein by reference in its entirety.

BACKGROUND OF THE INVENTION

1. Field of the Invention

The present invention relates generally to integrated circuits, and more particularly to integrated circuit testing.

2. Description of the Background Art

Integrated circuits designed with testability in mind may include provisions for scan testing. A scan test involves loading input scan data into a scan chain (also referred to as a "scan shift register", using the input scan data to test logic in the device-under-test (DUT), loading the scan chain with output scan data from the logic of the DUT, reading out the output scan data from the scan chain, and analyzing the output scan data to determine whether the DUT has passed or failed the test. In contrast to so called "boundary-scan-testing", scan tests allow for testing of logic deep in the DUT rather than just the boundaries of the DUT. Scan tests, in general, are known in the art and described in several publications including: A. Khoche, "Test Resource Partitioning for Scan Architectures using Bandwidth Matching," 2002 IEEE Test Resource Partitioning Workshop, October 2002, pp. 1.4-1 to 1.4-8; A. Crouch, "Design-For-Test For Digital IC's and Embedded Core Systems," Prentice Hall, 1999, pp. 93-133; and G. Maston, T. Taylor, and J. Villar, "Elements of STIL: Principles and Applications of IEEE Std. 1450," Kluwer Academic Publishers, 2003, pp. 201-205.

A scan chain may comprise multiple, serially connected flip-flops. A scan chain may use a scan clock to time the shifting of scan data from one flip-flop to another. Input scan data may be serially loaded into the scan chain and then unloaded in parallel for testing a logic circuit. Data from the logic circuit being tested may be loaded in parallel to the scan chain and then read out as output scan data for analysis. A scan architecture may also employ multiple scan chains. There are advantages to using multiple scan chains, including reduction of test time proportional to the reduction in length of the longest scan chain. A disadvantage of using multiple scan chains is that for each scan chain, independent scan in and scan out pins are required. Scan chains and the use of multiple scan chains are also discussed by A. Khoche in the aforementioned IEEE publication "Test Resource Partitioning for Scan Architectures using Bandwidth Matching."

A scan architecture may employ additional circuitry to reduce the number of pins needed when multiple scan chains are used. These additional circuitry are only used for test and may include broadcasting and compacting circuits. SynTest Technologies, Inc. of Sunnyvale, Calif. employs such an architecture in its Virtualscan™ tool suite.

A major disadvantage of the aforementioned scan architectures is that the added functionality and circuitry are added overhead as they are exclusively used for test purposes only. Furthermore, the added functionality and circuitry are usually not capable of supporting high-speed scan tests as they are based on conventional input/output test interfaces. Test time increases with the increase in the number of cycles to transfer the same amount of data across narrower serial in and out pins.

SUMMARY

In one embodiment, an integrated circuit includes a serial link interface configured to send and receive data over a serial bus both during normal operation and during scan tests. The integrated circuit may include data routing circuitry for transferring data between the serial link interface and a scan chain during a scan test, and for transferring data between the serial link interface and a core logic circuit of the integrated circuit, without going through the scan chain, during normal operation. Scan data may be generated and analyzed by a tester integrated circuit coupled to the integrated circuit over the serial bus.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
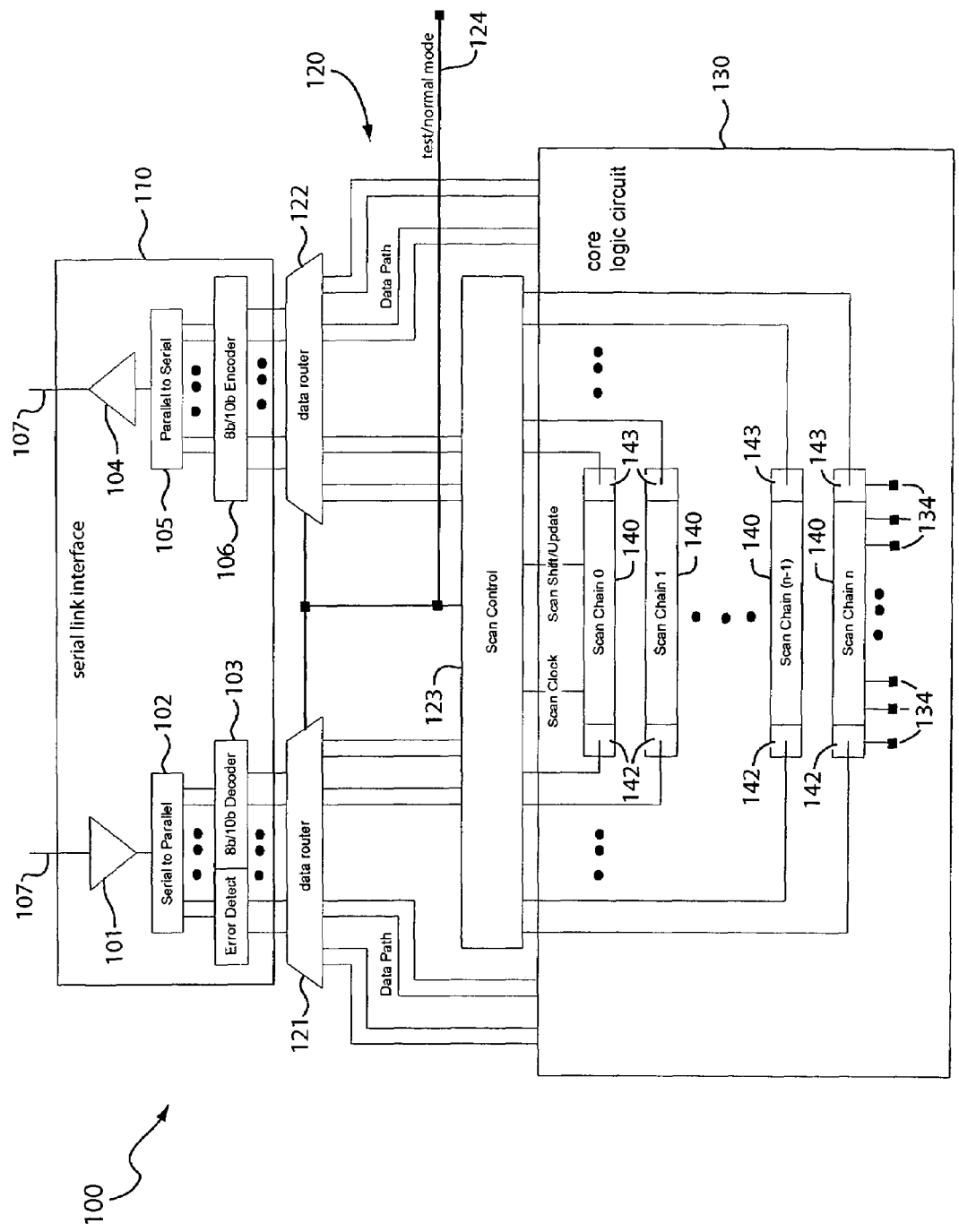
FIG. 1A shows a schematic diagram of an integrated circuit in accordance with an embodiment of the present invention.

FIG. 1A shows a schematic diagram of an integrated circuit 100 in accordance with an embodiment of the present invention. In the example of FIG. 1A, the integrated circuit 100 may operate in normal mode for normal operation or in test mode for test purposes. In normal mode, the integrated circuit 100 functions as designed to be employed in the field with other integrated circuits or electrical components. In test mode, the integrated circuit 100 is configured for testing, primarily in the factory but may also be in the field depending on implementation.

The integrated circuit 100 may include a serial link interface 110, a scan data path circuit 120, a core logic circuit 130, and scan chains 140. The serial link interface 110 may comprise circuitry for sending and receiving data over a serial bus in both the normal mode and the test mode. That is, the serial link interface 110 is not exclusively used for testing, but is an integral part of the integrated circuit 100 during normal operation. As will be more apparent below, embodiments of the present invention take advantage of the pre-existence of high-speed serial interfaces in integrated circuits to perform scan tests. Because these high-speed serial interfaces are also used during normal operation, they typically comply with industry standards, are relatively fast, and do not constitute additional overhead for testing. Embodiments of the present invention thus allow for relatively high-speed, low-overhead implementation of scan test in integrated circuits that have pre-existing serial link interfaces. Other suitable serial link interfaces include those employed in the PCI-Express I/O bus, SATA-I/O, OC-48, USB 2.0, Gigabit Ethernet, and IEEE 1394 (also know as "firewire"), to name a few examples.

In one embodiment, the serial link interface 110 comprises the physical layer (PHY) of a PCI-Express input/output (I/O) bus, and the bus 107 is a serial bus comprising a PCI-Express I/O bus. The PCI-Express I/O bus is a widely known and recognized serial bus in the computer industry. The integrated circuit 100 may be compliant with the standards set forth by the PCI-Sig organization. A PCI-Express packet of 128 bytes (i.e. 1024 bits) is a good match to an effective width of multiple scan chains. The data rate of PCI-Express also provides a good ratio of scan data delivery to scan shift frequency for effective scan testing. The PHY receives packets over the PCI-Express I/O bus, and extracts from the packets the input scan data that are shifted into the scan chains. Output scan data shifted out of the scan chains may also be sent out by way of the PCI-Express PHY. The use of the PC-Express I/O bus allows the integrated circuit 100 to send and receive scan data at relatively high speed while minimizing the number of external pins needed for scan test.

In the example of FIG. 1A, the serial link interface 110 includes a buffer 101, a serial to parallel converter 102, a decoder 103, a driver 104, a parallel to serial converter 105, and an encoder 106. The buffer 101 couples the serial link interface 110 to the bus 107 to receive serial input data over the bus. The bus 107 may comprise one or more lines, such as two pairs of differential lines in the case of PCI-Express I/O bus, for example. The serial to parallel converter 102 converts the serial input data to parallel input data, which are then decoded by the decoder 103 prior to being coupled to a data router 121. In one embodiment, the decoder 103 comprises an 8b/10b decoder. As shown in FIG. 1A, the decoder 103 may also include an error detection circuit to detect transmission errors. Going the other data direction, the encoder 106 encodes parallel output data received from the data router 122 for forwarding to the parallel to serial converter 105. The parallel to serial converter 105 converts the parallel output data to serial output data suitable for transmission over the bus 107 by way of the driver 104.

As its name implies, the scan data path circuit 120 provides data paths for forwarding data between the serial link interface 110, the core logic circuit 130, and the scan chains 140. A test/normal mode line 124 (or other mode selection mechanism) may be employed to place the integrated circuit 100 in either the normal mode or the test mode. When in the normal mode, the scan data path circuit 120 forwards parallel input data from the serial link interface 110 directly to the core logic circuit 130 without going through the scan chains 140, and forwards parallel output data from the core logic circuit 130 directly to the serial link interface 110 without going through the scan chains 140. This allows for removal of the scan chains 140 from the data path during normal operation. In test mode, the scan data path circuit 120 forwards parallel input data from the serial link interface 110 to one or more scan chains 140 as input scan data, and forwards output scan data from one or more scan chains 140 to the serial link interface 110 as parallel output data. This allows the integrated circuit 100 to leverage on the pre-existence of the serial link interface 110 and use it for scan test.

In the example of FIG. 1A, the scan data path circuit 120 includes data routers 121 and 122 and a scan control circuit 123. Data routers 121 and 122 may comprise multiplexer/de-multiplexer circuits or other data routing circuitry. In normal mode, the data router 121 forwards parallel input data from the serial link interface 110 directly to the core logic circuit 130 to bypass the scan chains 140. Similarly, in normal mode, the data router 122 forwards parallel output data received directly from the core logic circuit 130 to the serial link interface 110.

The scan control circuit 123 is configured to control data transfer to and from the scan chains 140 and to sequence scan steps during scan tests. In test mode, parallel input data forwarded to the scan control circuit 123 by the data router 121 are treated as input scan data. The scan control circuit 123 processes the input scan data so that they may be serially loaded into one or more scan chains 140. The scan control circuit 123 generates a scan clock for timing the serial shifting of the input scan data to a scan chain 140 and, in the other data direction, timing the serial shifting of output scan data from a scan chain 140. The scan control circuit 123 also generates control lines, such as scan shift/update control lines, to control the loading of scan data to and from a scan chain 140. In the example of FIG. 1A, the scan clock and control lines are provided to all the scan chains 140, but are not depicted as such for clarity of illustration.

In operation during test mode, the scan control circuit 123 performs a scan shift/update cycle to perform scan test on the core logic circuit 130. During a scan shift, the scan control circuit 123 serially shifts input scan data into a scan chain 140. The shifting of the input scan data into the scan chain 140 also serially shifts out output scan data already loaded in the scan chain 140. A scan update is performed to update the contents of the scan chain 140. During a scan update, the scan control circuit 123 controls parallel unloading of the input scan data from the scan chain 140 to the core logic circuit 130, and parallel loading of output scan data from the core logic circuit 130 to the scan chain 140. The next scan shift serially shifts out the current output scan data from the scan chain 140 and serially shifts in new input scan data into the scan chain 140. As will be more apparent below, the output scan data may be ultimately forwarded to a tester integrated circuit on the same serial bus as the integrated circuit 100 for analysis. It may take several scan shift/update cycles to complete a scan test.

The core logic 130 comprises the main logic circuitry (as opposed to interface and test circuitry) of the integrated circuit 100. The core logic 130 may comprise the main circuits of a PCI-Express device, such as a PCI-Express switch or an end-point device. In the example of FIG. 1A, each scan chain 140 is connected to a corresponding node 134 of the core logic circuit 130 for scan test. This allows for transfer of scan data between the core logic circuit 130 and the scan chains 140 during scan test of the core logic circuit 130. Note that in FIG. 1A, only some of the nodes 134 of the core logic circuit 130 are depicted and labeled for clarity of illustration.

A scan chain 140 may comprise a shift register with parallel load/unload. For example, a scan chain 140 may have serially connected flip-flops. The output (e.g. "Q" output) of one flip-flop is connected to the input (e.g. "D" input) of the next flip-flop to form a scan chain. Each scan chain 140 has a scan input node 142 connected to the input of the first flip-flop in the chain and a scan output node 143 connected to the output of the last flip-flop in the chain. Scan data may be serially shifted into the scan chain 140 through the scan input node 142 and serially shifted out of the scan chain 140 through the scan output node 143. Each scan chain 140 allows for parallel unloading of input scan data into the core logic circuit 130 and parallel loading of output scan data from the core logic circuit 130. Parallel data transfer between a scan chain 140 and the core logic circuit 130 may be performed over parallel lines connecting input/output pins between each flip-flop in the chain to corresponding nodes 134 of the core logic circuit 130.

During a scan test, the core logic circuit 130 receives input scan data from the scan chains 140 and runs the input scan data through its logic. The result of running the input scan data through the logic is loaded into the scan chain 140 as output scan data. The output scan data may be ultimately forwarded to a tester integrated circuit, where the output scan data may be compared to expected (i.e. known good) scan data to determine if the integrated circuit 100 has passed or failed the scan test.

Figure 1B:
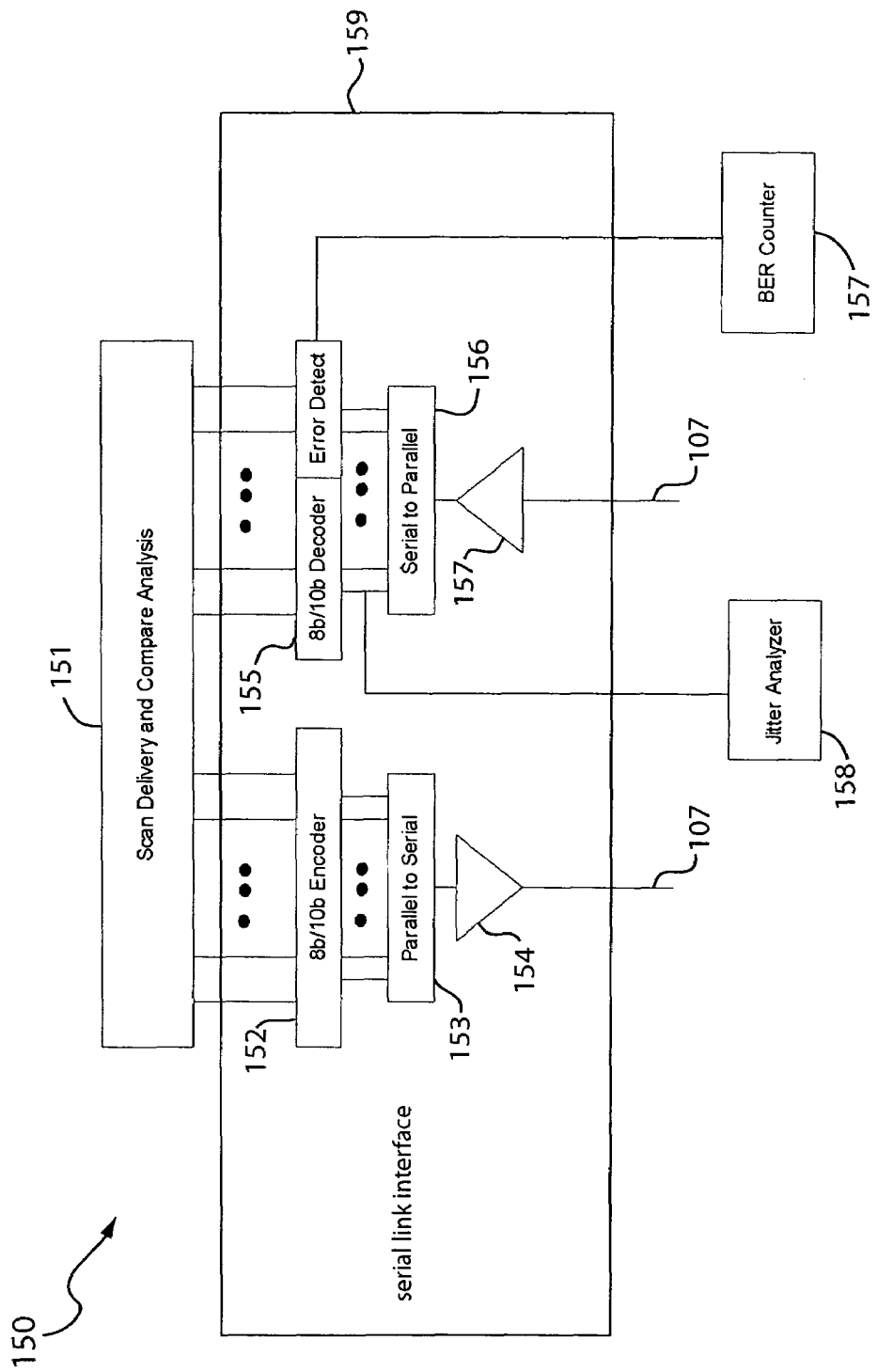
FIG. 1B shows a schematic diagram of a tester integrated circuit in accordance with an embodiment of the present invention.

FIG. 1B shows a schematic diagram of a tester integrated circuit 150 in accordance with an embodiment of the present invention. The tester integrated circuit 150 and the integrated circuit 100 form a test environment. In the example of FIG. 1B, the tester integrated circuit 150 is also referred to as a "golden unit." Advantageously, the tester integrated circuit 150 employs the same type of serial link interface as the integrated circuit 100. That is, the tester integrated circuit 150 may be coupled to the integrated circuit 100 on the same bus 107 to allow for scan test without having to use relatively expensive automated test equipment (ATE). In essence, the tester integrated circuit 150 provides relatively low cost "test equipment on a chip."

In the example of FIG. 1B, the tester integrated circuit 150 includes a scan delivery and compare analysis circuit 151, serial link interface 159, a jitter analyzer 158, and a bit error rate (BER) counter 157. As its name implies, the circuit 151 generates input scan data (also referred to as "scan vector") for delivery to the integrated circuit 100 by way of the serial link interface 159. The input scan data are received in the integrated circuit 100, where one or more scan shift/update cycles are performed to generate resulting output scan data as previously discussed. The output scan data are received in the circuit 151 by way of the serial link interface 159 for comparison and analysis to determine if the integrated circuit 100 has passed or failed the scan test. For example, the output scan data from the integrated circuit 100 may be compared to known good scan data. It is to be noted that the mechanics of generating and analyzing scan data, in general, are known in the art and not further discussed here.

In one embodiment, the serial link interface 159, like the serial link interface 110 of the integrated circuit 100, comprises the PHY of a PCI-Express I/O bus. In the example of FIG. 1B, the serial link interface 159 includes a buffer 157, a serial to parallel converter 156, a decoder 155, a driver 154, a parallel to serial converter 153, and an encoder 152. The buffer 157 couples the serial link interface 159 to the bus 107 (e.g. PCI-Express I/O bus) to serially receive output scan data from the integrated circuit 100. The serial to parallel converter 156 converts the serially received output scan data to parallel, which are then decoded by the decoder 155 prior to being coupled to the circuit 151. In one embodiment, the decoder 155 comprises an 8b/10b decoder. As shown in FIG. 1B, the decoder 155 may also include an error detection circuit to check the output scan data for transmission errors. The BER counter 157 is coupled to the error detection circuit to monitor the transmission bit-error rate and determine if the bit-error rate has exceeded a predetermined maximum (i.e. "failed") value. A jitter analyzer 158 may be coupled between the serial to parallel converter 156 and the decoder 155 to analyze jitter in the data stream received over the bus 107. The results of the BER counter 157 and the jitter analyzer 158 may be fed to the circuit 151 or another test monitoring circuit to determine if the integrated circuit 100 is capable of communicating over the bus. Because the integrated circuit 100 communicates with the tester integrated circuit 150 using a serial link interface that is also employed during normal operation (i.e. in normal mode), tests relating to data communications via the serial link interface may also be performed at the same time as the scan test, thereby advantageously reducing total test time.

In the other data direction, the encoder 152 encodes input scan data generated by the circuit 151 for forwarding to the parallel to serial converter 153. The parallel to serial converter 153 converts the scan data to serial data suitable for transmission over the bus 107 by way of the driver 154.

Figure 2:
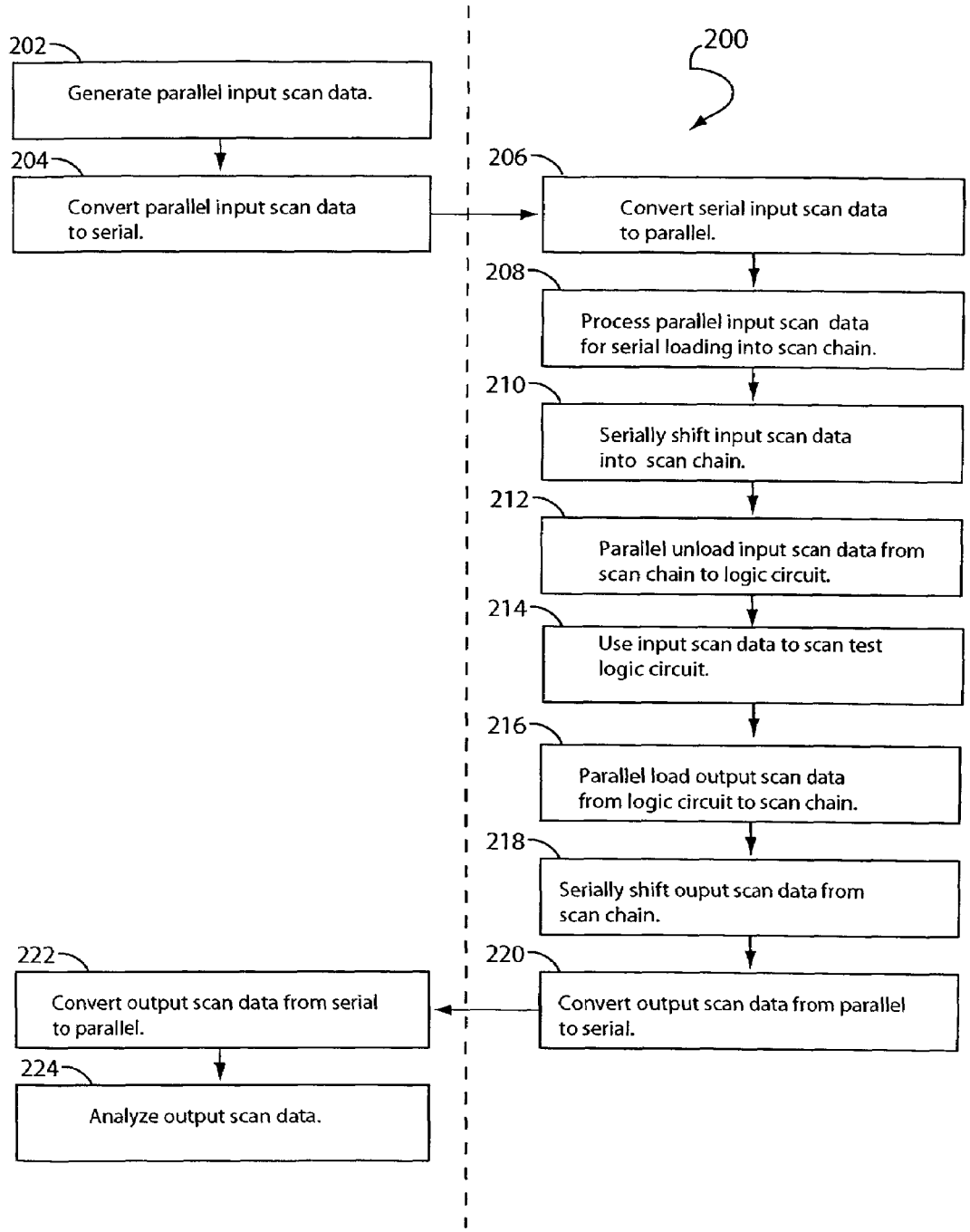
FIG. 2 shows a flow diagram of a method of performing scan tests in integrated circuits in accordance with an embodiment of the present invention.

Referring now to FIG. 2, there is shown a flow diagram of a method 200 for performing scan tests in integrated circuits in accordance with an embodiment of the present invention. The method 200 may be performed using the components shown in FIGS. 1A and 1B. Other components may also be used without detracting from the merits of the present invention.

In the example of FIG. 2, the steps on the left-hand side are performed by a tester integrated circuit, while the steps on the right hand side are performed by an integrated circuit under test (i.e. the DUT). The method 200 assumes that the integrated circuit under test is placed in test mode prior to initiating step 202.

In step 202, a scan delivery and compare analysis circuit generates parallel input scan data suitable for scan test.

In step 204, a serial link interface in the tester integrated circuit converts the parallel input scan data to serial for transmission over a high-speed serial bus, such as a PCI-Express I/O bus. The tester integrated circuit may include the input scan data in one or more packets that are sent over the PCI-Express bus at relatively high speed, preferably at a data transfer rate greater than about 2.0 Gbits/second (e.g. 2.5 Gbits/second). Each of the PCI-Express packets may be 1024 bits long.

In step 206, the input scan data are converted to parallel after they are received in the integrated circuit under test. Step 206 may be performed by a serial link interface in the integrated circuit under test. For example, after receiving the PCI-Express packet containing the input scan data, the serial link interface may extract the input scan data from the PCI-Express packet and forward the input scan data to a scan control circuit.

In step 208, the parallel input scan data are processed for serial loading into a scan chain. Step 208 may be performed by a scan control circuit (e.g. scan control circuit 123 of FIG. 1A), for example.

In step 210, the input scan data are serially shifted into the scan chain. Step 210 is also referred to as a "scan shift." The input scan data may be serially shifted into the scan chain at a reduced rate compared to the data transfer rate over the bus. The rate at which the input scan data are shifted into the scan chain may be chosen efficiently based on the ratio of the number of scan chains versus the serial data rate or the available internal clocks or tester clocks. Note that current contents of the scan chain (previous output scan data) are serially shifted out of the scan chain as the input scan data are shifted in.

In step 212, the input scan data in the scan chain are unloaded in parallel into the core logic circuit of the integrated circuit under test.

In step 214, the input scan data are used to test the core logic circuit. The input scan data are run through the core logic circuit to generate a response from the core logic circuit, referred to as "output scan data."

In step 216, output scan data from the core logic circuit are loaded in parallel into the scan chain. Steps 212, 214, and 216 constitute what is also referred to as a scan update or capture.

In step 218, the output scan data are serially shifted out of the scan chain. Step 218 also results in new input scan data being serially shifted into the scan chain.

In step 220, the serial link interface in the integrated circuit under test converts the parallel output scan data to serial for transmission over the high-speed serial bus, which is a PCI-Express I/O bus in this example. The integrated circuit under test may include the output scan data in one or more packets that are sent over the PCI-Express bus at a data transfer rate greater than about 2.0 Gbits/seconds (e.g. 2.5 Gbits/second).

In step 222, the output scan data are converted to parallel after they are received in the tester integrated circuit. For example, after receiving the PCI-Express packet containing the output scan data, the serial link interface in the tester integrated circuit may extract the output scan data from the PCI-Express packet and forward the output scan data to the scan delivery and compare analysis circuit for analysis. The PCI-Express packet may also be checked for transmission errors. A jitter analyzer in the tester integrated circuit may also analyze the jitter of the incoming data stream.

In step 224, the scan delivery and compare analysis circuit analyzes the output scan data. For example, the scan delivery and compare analysis circuit may compare the output scan data to known good data to determine if the integrated circuit under test has passed or failed the scan test.

Note that in a typical test environment, it may take several PCI-Express packets and scan shift/update cycles to complete a scan test. Furthermore, the sequence of steps of method 200 may be performed in a different sequence depending on implementation.

The above-disclosed embodiments of the present invention provide numerous advantages heretofore unrealized. Firstly, the embodiments minimize the number of external pins needed for scan test, while maximizing the number of available scan chains, and a parallel port is no longer required. Secondly, the embodiments leverage pre-existing circuitry that is needed by the integrated circuit for normal operation anyway. Thirdly, the embodiments allow for testing of a serial link interface, which is also used for data transfer in normal operation, at the same time as the scan test at speed for a wide range of data. Fourthly, the embodiments reduce test time, thus reducing cost, because scan data (vectors) are sent and received at relatively high-speed, greater than about 2.0 Gbits/second (e.g. 2.5 Gbits/second in the case of PCI-Express). Fifthly, the use of the disclosed tester integrated circuit decouples test functionality from automated test equipment (ATE) requirement, such as large vector memory and high speed driver, thereby providing low cost test capability while also allowing for concurrent test of both logic circuits and serial link interfaces (PHY in the case of PCI-Express).

Improved methods and apparatus for scan test have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An integrated circuit capable of operating in a normal mode and a test mode, the integrated circuit being configured for normal operation when in the normal mode and for scan test in the test mode, the integrated comprising:
   a serial link interface configured to allow the integrated circuit to communicate over a serial bus, the serial link interface being employed to send and receive serial data in the normal mode and in the test mode;
   a scan chain configured for scan testing, the scan chain having a serial input node for serially accepting input scan data, a serial output node for serially outputting output scan data, and parallel connections to a core logic circuit of the integrated circuit;
   a scan control circuit configured to serially shift the input scan data to the input node of the scan chain and to serially shift out the output scan data from the serial output node of the scan chain; and
   a data router configured to route the input scan data from the serial link interface to the scan control circuit in the test mode, the data router being configured to transfer data between the serial link interface and the core logic circuit without going through the scan chain in the normal mode.

2. The integrated circuit of claim 1 wherein, in the test mode, the scan control circuit is configured to receive the input scan data in parallel from the serial link interface and to forward the output scan data in parallel to the serial link interface.

3. The integrated circuit of claim 1 wherein the input scan data are generated by another integrated circuit having a same type serial link interface as the integrated circuit.

4. The integrated circuit of claim 3 wherein the other integrated circuit includes circuitry for monitoring bit error rate of data communications with the integrated circuit.

5. The integrated circuit of claim 3 wherein the other integrated circuit includes circuitry for analyzing jitter of data stream between the integrated circuit and the other integrated circuit.

6. The integrated circuit of claim 1 wherein the input scan data and the output scan data are transmitted over the bus in packets at a data transfer rate greater than 2.0 Gbits/second.

7. The integrated circuit of claim 1 wherein the serial link interface comprises:
   a serial to parallel converter configured to convert input serial data received over the serial bus to input parallel data;
   an 8b/10b decoder configured to decode the input parallel data;
   an 8b/10b encoder configured to encode output parallel data received from the scan control circuit; and
   a parallel to serial converter configured to convert the output parallel data to output serial data for transmission over the serial bus.

* * * * *